United States Patent [19]

Deprez et al.

[11] Patent Number: 5,622,809
[45] Date of Patent: Apr. 22, 1997

[54] KIT FOR MAKING A PROCESSING LIQIUD FOR PROCESSING A LITHOGRAPHIC PRINTING PLATE

[75] Inventors: Lode Deprez, Wachtebeke; Johan Loccufier, Zwijnaarde; Jos Vaes, Betekom, all of Belgium

[73] Assignee: Agfa-Gevaert N.V., Mortsel, Belgium

[21] Appl. No.: 617,380

[22] Filed: Mar. 18, 1996

[30] Foreign Application Priority Data

Mar. 21, 1995 [EP] European Pat. Off. .............. 95200693

[51] Int. Cl.⁶ ..................................................... G03C 5/50
[52] U.S. Cl. ............................................. 430/250; 430/249
[58] Field of Search ................................... 430/249, 250, 430/331, 465

[56] References Cited

U.S. PATENT DOCUMENTS 5,204,230  4/1993  Hayashi ................................... 430/465

FOREIGN PATENT DOCUMENTS 665587  6/1963  Canada ................................... 430/466

*Primary Examiner*—Hoa V. Le
*Attorney, Agent, or Firm*—Brumbaugh, Graves, Donohue & Raymond

[57] ABSTRACT

A kit for preparing a processing liquid for use in preparing a lithographic printing plate according to silver salt diffusion transfer processing, and comprising all necessary active compounds for preparing said processing liquid, said active compounds including a solid hydrogensulphite amine complex or a solid sulphurdioxide amine complex, said amine of said complexes being capable of acting as a silver halide solvent.

6 Claims, No Drawings

KIT FOR MAKING A PROCESSING LIQIUD FOR PROCESSING A LITHOGRAPHIC PRINTING PLATE

FIELD OF THE INVENTION

The present invention relates to a kit for preparing a processing liquid for use in preparing a lithographic printing plate according to the silver salt diffusion transfer process.

BACKGROUND OF THE INVENTION

The principles of the silver complex diffusion transfer reversal process, hereinafter called DTR-process, have been described e.g. in U.S. Pat. No. 2,352,014 and the book "Photographic Silver Halide Diffusion Processes" by André Rott and Edith Weyde—The Focal Press—London and New York, (1972).

According to the DTR process, a silver complex salt is image-wise transferred by diffusion from the image-wise exposed silver halide emulsion layer into the image receiving layer, where it is converted to a silver image usually in the presence of physical development nuclei. For this purpose, the image-wise exposed silver halide emulsion layer is developed in the presence of a developing agent and non-developed silver halide is converted by means of a silver halide complexing agent into a soluble silver complex salt while in contact with an image receiving layer.

A DTR-image bearing material an be used as a planographic printing plate wherein the DTR-silver image areas form the water-repellant ink-receptive areas on a water-receptive ink-repellant surface. The DTR-image can be formed in the image-receiving layer of a sheet or web material which is a separate element with respect to the photographic silver halide emulsion material (a so-called two-sheet DTR element) disclosed in e.g. DE-A-2.346.378 or in the image-receiving layer of a so-called single-support-element, also called mono-sheet element, which contains at least one photographic silver halide emulsion layer integral with an image-receiving layer in water permeable relationship therewith. It is the latter mono-sheet version which is preferred for the preparation of offset printing plates by the DTR method.

In order to prepare a lithographic printing plate from a monosheet DTR imaging element, the imaging element is developed in an alkaline processing liquid subsequent to an image-wise exposure. Preferably, the obtained plate is Subsequently stabilised using a stabilising liquid that reduces the surface pH of the plate after the alkaline development. An alkaline processing liquid generally comprises as active compounds, an inorganic alkali, a hydrophobizing agent, an inorganic sulphite and a silver halide solvent. Optionally, the alkaline processing liquid also comprises a developing agent. The stabilising liquid generally has a pH between 4 and 7, conveniently achieved with a buffer, and preferably also comprises a hydrophobizing agent.

A substantial waste of packaging, generally in plastic form, is generated by shipping the processing liquids in ready-to-use form thereby presenting an ecological disadvantage and causing inconvenience for customers using substantial volumes.

Accordingly, the need exists for bringing one or more processing liquids in a more concentrated and convenient form. In the past, proposals have been made to freeze dry or spray-dry a processing liquid so that it can be shipped in a solid form and dissolved in e.g. water when needed. However, Such procedure is not appropriate in case the processing liquid comprises an amine as a silver halide solvent because the latter is generally liquid at ambient temperature so that after freeze-dry or spray-dry a paste, which is inconvenient to handle, results.

JP 06-118575 discloses that an alkanolamine, also called aminoalcohol, may be solidified by adding a lewis acid such as HCl or $H_2SO_4$ thereto. However, when an alkanolamine/HCl or an alkanolamine/$H_2SO_4$ complex is dissolved together with the other active compounds of the processing liquid, a processing liquid is obtained that does not always yields printing plates with good performance, in particular not when processing under critical conditions such as fast processing or when the liquid has been in use for some time and becomes exhausted to some extend.

SUMMARY OF THE INVENTION

It is an object of the present invention to provide kit for making a processing liquid for use in the preparation of a lithographic printing plate according to silver salt diffusion transfer processing and wherein the processing liquid includes an amine as a silver halide solvent.

Further objects of the present invention will become clear from the description hereinafter.

According to the present invention there is provided a kit for preparing a processing liquid for use in preparing a lithographic printing plate according to silver salt diffusion transfer processing, and comprising all necessary active compounds for preparing said processing liquid, said active compounds including a solid hydrogensulphite/amine complex or a solid sulphurdioxide/amine complex, said amine of said complexes being capable of acting as a silver halide solvent.

According to the present invention a use of said kit is provided to obtain a processing liquid therewith.

DETAILED DESCRIPTION OF THE INVENTION

In accordance with the present invention a liquid amine which is used as a silver halide solvent in a processing liquid, may be solidified by converting the liquid amine into a solid hydrogensulphite/amine complex or into a solid sulphurdioxide/amine complex. When such a solid complex is redissolved, together with other active compounds, in water, a processing liquid is obtained having a similar performance of a processing liquid that is provided in a ready-to-use form to a customer. Even under critical processing conditions, no substantial differences between a ready-to-use processing liquid and a liquid prepared using a kit in accordance with this invention, are observed.

Suitable amines for use as a silver halide solvent in connection with the present invention include ethylenediamine, propylenediamine, aminothioethers, cyclic amines such as e.g. piperidine etc. Particularly preferred amines are alkanolamines. Alkanolamines that are suitable for use in accordance with the present invention may be of the tertiary, secondary or primary type. Examples of alkanolamines that may be used in connection with the present invention correspond to the following formula:

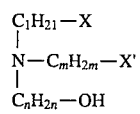

wherein X and X' independently represent hydrogen, a hydroxyl group or an amino group, 1 and m represent 0 or integers of 1 or more and n represents an integer of 1 or more. Preferably used alkanolamines are e.g. N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol etc. or mixtures thereof.

A solid hydrogensulphite/amine complex in accordance with the present invention may be conveniently obtained by adding an aqueous solution of hydrogensulphite to a liquid amine and subsequently removing residual water either by evaporating water under a reduced pressure or by freeze-drying the mixture.

A solid sulphurdioxide/amine complex in accordance with the present invention may be conveniently obtained by guiding $SO_2$ gas through a liquid amine. Such procedure is preferably carried out under essentially dry conditions.

In accordance with the present invention the amine complex is provided in a kit for preparing a processing liquid together with other active compounds of such processing liquid. Such kit may be a kit of parts comprising two or more parts being physically separated from each other. A processing liquid may be prepared from a kit in accordance with the present invention by dissolving all active compounds comprised in the kit in later.

According to a particular embodiment of the present invention, a kit is provided for preparing an alkaline processing liquid therefrom. An alkaline processing liquid preferably includes at least an amine as a silver halide solvent, an inorganic alkali, a hydrophobizing agent and an inorganic sulphite such as e.g. potassium sulphite, sodium sulphite or ammonium sulphite as active compounds. Inorganic sulphite may be left out depending on the amount of sulphite contained in the amine complex.

As inorganic alkali that may be used in connection with the present invention there are sodium hydroxide, potassium hydroxide, magnesium oxide, carbonates such as e.g. calcium carbonate etc.

The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl containing at least 4 carbon atoms. Examples of hydrophobizing agents for use in accordance with the present invention are e.g. those described in U.S. Pat. No. 3,776,728, and U.S. Pat. No. 4,563,410. Preferred compounds correspond to one of the following formulas:

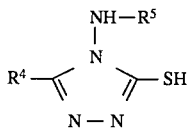

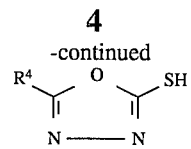

wherein $R^5$ represents hydrogen or an acyl group, $R^4$ represents alkyl, aryl or aralkyl. Most preferably used compounds are compounds according to one of the above formulas wherein $R^4$ represents an alkyl containing 4 to 16 C-atoms.

Further hydrophobizing agents for use in connection with the present invention correspond to the following formula:

wherein Z represents a substituted or unsubstituted alkyl, a substituted or unsubstituted aryl, an aralkyl, an alkylaryl, a substituted or unsubstituted alkenyl, a substituted or unsubstituted alkynyl or a heterocyclic ring.

Specific examples of compounds according to the latter formula (A) are:

| compound no. | Z in formula (A) |
| --- | --- |
| H1 | $CH_2CONH\text{-}n.C_6H_{13}$ |
| H2 | $CH_2CON(n.C_4H_9)_2$ |
| H3 | $n.C_6H_{13}$ |
| H4 | $n.C_8H_{17}$ |
| H5 | $n.C_4H_9$ |

In connection with the present invention it is preferred to add an additional amount of silver halide solvent to a kit for preparing an alkaline processing liquid. Suitable silver halide solvents for use in connection with the present invention are e.g. thiocyanates, thiosulphates, thioethers as disclosed in e.g. U.S. Pat. No. 5,200,294. A particular preferred type of silver halide solvents are meso-ionic compounds such as e.g. a triazolium thiolate or tetrazolium thiolate. Highly preferred meso-ionic compounds correspond to the following formula:

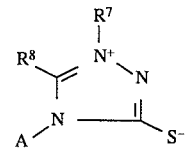

wherein $R^7$ and $R^8$ each independently represents an unsubstituted or substituted alkyl group, alkenyl group, cycloalkyl group, aralkyl group, aryl group or heterocyclic group, A represents an unsubstituted or substituted alkyl group, alkenyl group, cycloalkyl group, aralkyl group, aryl group, heterocyclic group or -$NR^9R^{10}$ and $R^9$ and $R^{10}$ each independently represents hydrogen, an alkyl group or aryl group and wherein $R^7$ and $R^8$ or $R^8$ and A or $R^9$ and $R^{10}$ can combine with each other to form a 5- or 6-membered ring.

The meso-ionic compounds are preferably used in combination with an alkanolamine. Further silver halide solvents that may be used in connection with the present invention are e.g. 2-mercaptobenzoic acid, cyclic imides and oxazolidones.

An alkaline processing liquid may further include other active compounds such as developing agents, calcium sequestering agents and development accelerators. Developing agents suitable for use in connection with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidinone, and 1-phenyl-4,4-dimethyl-3-pyrazolidinone.

According to a particularly preferred embodiment of the invention, a kit for preparing an alkaline processing liquid is provided composed of two or more parts that contain the active compounds and that are physically separated. One of these parts preferably contains inorganic alkali in a solid form whereas the other part or parts contain a hydrophobizing agent and are substantially free from inorganic alkali. Preferably, the amine complex is added to a part being substantially free from inorganic alkali.

According to a further preferred embodiment, the hydrophobizing agent is provided at the surface of solid particles that are soluble in the alkaline processing liquid. Suitable solid particles are e.g. powdered active compounds of an alkaline processing liquid such as e.g. the amine complex, inorganic sulphite, additional solid silver halide solvents or mixtures thereof. The hydrophobizing agent may be provided at the surface of solid particles e.g. by dissolving the hydrophobizing agent in a rapidly evaporating solvent such as e.g. ethanol and spraying such solution on solid particles preferably while air whirling the solid particles.

A kit in accordance with the present invention is also suitable for preparing a stabilising liquid that may include a hydrophobizing agent (e.g. as mentioned above) and to be used in the making of a printing plate according to the DTR-process. A stabilising liquid generally has a pH between 5 and 7 A stabilising liquid in connection with the present invention preferably contains a buffer e.g. a phosphate buffer, a citrate buffer or mixture thereof and an amine, preferably an alkanol amine such as the alkanol amines listed above (acting as a silver halide solvent and as a buffer). The buffer capacity of a stabilising liquid is preferably such that the addition of 0.5 ml of a 1 molar aqueous sodium hydroxide solution to 50 ml of stabilising liquid does not increase the pH of the stabilising liquid above 6.5. A stabilising liquid can further contain bactericides, e.g. phenol, thymol or 5-bromo-5-nitro-1,3-dioxan as described in EP 0,150,517. A stabilising liquid can also contain substances which influence the hydrophobic/hydrophilic balance of the printing plate obtained after processing of the DTR element, e.g. silica. Further the stabilising liquid can contain wetting agents and preferably compounds (wetting agents) containing perfluorinated alkyl groups.

Similar as disclosed above for a kit for preparing an alkaline processing liquid, a kit for preparing a stabilising liquid may be composed of two or more parts containing the active compounds of the stabilising liquid and being physically separated from each other. However, it is most convenient to provide a kit for a stabilising liquid including all active compounds in solid form, e.g. powdered and mixed together in one part. In case a hydrophobizing agent is present, this will be preferably provided at the surface of solid particles that are soluble in the estabilising liquid.

It is further preferred in accordance with the present invention to provide a polyol such as e.g. ethylene glycol, propylene glycol or glycerin at the surface of solid particles present in a kit in accordance with the present invention. Such increases the handling convenience of the kit when preparing a processing liquid therefrom and has a beneficial effect on the performance of a printing plate obtained with such a processing liquid.

A processing liquid prepared from a kit in accordance with the present invention is suitable for preparing a lithographic printing plate from an imaging element according to the silver salt diffusion transfer process. Such imaging element preferably comprises on a support a silver halide emulsion layer and a physical development nuclei layer provided in that order. Optionally, a base layer or antihalation layer can be provided between the support and the silver halide emulsion layer.

According to a typical method for preparing a printing plate, an imaging element as described above is image-wise exposed, e.g. by camera or laser, and is subsequently developed using an alkaline processing liquid. Preferably, the alkaline development is followed by a stabilisation using a stabilizing liquid that generally reduces the pH at the surface of the printing plate. Such method is disclosed in e.g. U.S. Pat. No. 5,200,294.

According to an alternative method, a printing plate may be obtained using an imaging element comprising on an aluminium support in the order given a layer containing physical development nuclei and a silver halide emulsion layer. After image-wise exposure such imaging element is developed using an alkaline processing liquid and is subsequently washed to remove the silver halide emulsion layer and other optional layers so as to expose a silver image formed in the layer containing the physical development nuclei. Such method is disclosed in e.g. EP-A 410500.

The invention will now be illustrated by the following examples without however the intention to limit the invention thereto. All parts given are by weight unless otherwise specified.

EXAMPLE 1

Preparation of the silver halide emulsion coating solution

A silver chlorobromide emulsion composed of 98.2 mole % of chloride and 1.8 mole % of bromide was prepared by the double jet precipitation method. The average silver halide grain size was 0.4 pm (diameter of a sphere with equivalent volume) and contained Rhodium ions as internal dopant. The emulsion was orthochromatically sensitized and stabilized.

A base layer coating solution was prepared having the following composition:

| | |
|---|---|
| gelatin | 5.5% |
| carbon black | 0.76% |
| silica particles (5 μm) | 1.6% |

Preparation of the imaging element

The emulsion coating solution and base layer coating solution were simultaneously coated by mean, of the cascade coating technique to a polyethylene terephthalate support provided with a pack of two backing layers such that the base layer coating was coated directly to the side of the support opposite to the side containing said backing layers. The emulsion layer was coated such that the silver halide coverage expressed as $AgNO_3$ was 1.5 $g/m^2$ and the gelatin content was 1.5 $g/m^2$. The emulsion layer further contained 0.15 $g/m^2$ of 1-phenyl-4-methyl-3-pyrazolidone and 0.25 $g/m^2$ of hydroquinone. The base layer was coated such that the amount of gelatin in the coated layer was 3 $g/m^2$.

The thus obtained element was dried and subjected to a temperature of 40° C. for 5 days and then the emulsion layer was overcoated with a layer containing PdS as physical development nuclei, hydroquinone at 0.4 g/m² and formaldehyde at 100 mg/m².

An alkaline processing liquid was prepared by dissolving parts A and B of the following kits into 1 liter of water:

Kit no. 1:

| part A: | sodium hydroxide | 66 g |
| --- | --- | --- |
| | EDTA sodium salt | 1 g |
| part B: | AEAE/H$_2$SO$_3$ (mol ratio: 1/1) complex | 80 g |
| | methylhydroquinone | 2 g |
| | hydrophobizing agent | 350 mg |
| | compound A | 800 mg |

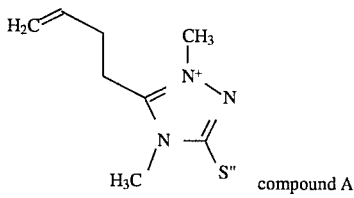 compound A hydrophobizing agent=2-mercapto-5-n-heptyl-oxa-3,4-diazole AEAE=amino-ethyl-aminoethanol Kit no. 2:

| part A: | similar as part A of kit no. 1 but with the addition of 54 g Na$_2$SO$_3$. | |
| --- | --- | --- |
| part B: | AEAE/H$_2$SO$_4$ (mol ratio: 1/1) complex | 87 g |
| | methylhydroquinone | 2 g |
| | hydrophobizing agent | 350 mg |
| | compound A | 800 mg |

Kit no. 3:

| part A: | similar as part A of kit no. 1 but with the addition of 54 g Na$_2$SO$_3$. | |
| --- | --- | --- |
| part B: | AEAE/HCl (mol ratio: 1/2) complex | 77 g |
| | methylhydroquinone | 2 g |
| | hydrophobizing agent | 350 mg |
| | compound A | 800 mg |

The following stabilising liquid was prepared:

| triethanol amine | 10 g |
| --- | --- |
| surfactant | 0.2 g |
| hydrophobizing agent no. H2 (see above) | 0.8 g |
| NaH$_2$PO$_4$.2H$_2$O | 40 g |
| water to make | 1 liter |

To prepare printing plates from the above described imaging element, the imaging element was image-wise exposed (camera exposure) and then developed using one of the alkaline processing liquids obtained from the 3 kit of parts disclosed above (temperature of 30° C. and processing time of 15 seconds). Subsequent to this development, the plates were guided through a stabilising liquid having a composition as disclosed above.

The obtained printing plates were then used to print on a printing press using a commonly employed ink and an aqueous dampening liquid containing colloidal silica. Printing endurance for each of the printing plates was evaluated and the results were as follows:

| Plate prepared using alkaline processing liquid obtained from Kit no. | Printing endurance |
| --- | --- |
| 1 | >10000 |
| 2 | 6000 |
| 3 | 7000 |

EXAMPLE 2

Printing plates were prepared similar as described in example 1 but instead of using an alkaline processing liquid obtained from one of the kits, the following ready-to-use alkaline processing liquid (obtained by dissolving the different compounds in a conventional way) was used:

| Na$_2$SO$_3$ | 54 g |
| --- | --- |
| EDTA | 1 g |
| AEAE | 45 g |
| methylhydroquinone | 2 g |
| hydrophobizing agent | 350 mg |
| compound A | 800 mg |
| sodium hydroxide | 31 g |
| water to make | 1 liter |

The obtained printing plates showed a printing endurance of more than 10000 copies.

We claim:

1. A kit for preparing a processing liquid for use in preparing a lithographic printing plate according to silver salt diffusion transfer processing, and comprising all necessary active compounds for preparing said processing liquid, said active compounds including a solid hydrogensulphite amine complex or a solid sulphurdioxide amine complex, said amine of said complexes being capable of acting as a silver halide solvent.

2. A kit according to claim 1 wherein said solid hydrogensulphite amine complex is a solid hydrogensulphite aminoalcohol complex and wherein said sulphurdioxide amine complex is a solid sulphurdioxide aminoalcohol complex.

3. A kit according to claim 1 wherein said processing liquid is an alkaline processing liquid or a stabilising liquid.

4. A kit according to claim 1 where said kit consists of two or more parts being physically separated.

5. A kit according to claim 1 wherein said processing liquid is an alkaline processing liquid including a hydrophobizing agent and inorganic alkali as active compounds and wherein said kit consists of two parts or more parts, one part comprising an inorganic alkali in solid form and being substantially free of hydrophobizing agent and another part comprising hydrophobizing agent.

6. The method of using a kit as defined in claim 1 for preparing a processing liquid for use in preparing a lithographic printing plate according to silver salt diffusion transfer processing.

* * * * *

UNITED STATES PATENT AND TRADEMARK OFFICE
CERTIFICATE OF CORRECTION

PATENT NO. : 5,622,809
DATED : April 22, 1997
INVENTOR(S) : Deprez et al.

It is certified that error appears in the above-identified patent and that said Letters Patent is hereby corrected as shown below:

Column 1, line 47, "Sub-" should read --sub---;

Column 2, line 1, "Such" should read --such--;

Column 3, line 35, "later" should read --water--;

Column 5, line 36, "7 A" should read --7. A--;

Column 6, line 42, "0.4 pm" should read --0.4 µm--;

Column 6, line 55, "mean," should read --means--;

Column 8, line 56. "The method" should read --A method--.

Signed and Sealed this

Twenty-fifth Day of November, 1997

Attest:

BRUCE LEHMAN

Attesting Officer

Commissioner of Patents and Trademarks